United States Patent [19]

Joist et al.

[11] Patent Number: 5,170,894

[45] Date of Patent: Dec. 15, 1992

[54] INSULATING STRIP FOR A COMPONENT CARRIER

[75] Inventors: Michael Joist, Gaggenau; Hans-Ulrich Günther, Pfinztal, both of Fed. Rep. of Germany

[73] Assignee: Schroff GmbH, Straubenhardt, Fed. Rep. of Germany

[21] Appl. No.: 755,138

[22] Filed: Sep. 5, 1991

[30] Foreign Application Priority Data

Sep. 14, 1990 [DE] Fed. Rep. of Germany ... 9013093[U]

[51] Int. Cl.⁵ .................................. A47G 19/08
[52] U.S. Cl. ...................... 211/41; 403/387; 403/393; 361/415
[58] Field of Search ................ 361/415, 429; 248/223.4, 239, 259, 298; 211/41; 403/387, 393; 439/62, 64

[56] References Cited

U.S. PATENT DOCUMENTS

| | | | |
|---|---|---|---|
| 3,838,777 | 10/1974 | Thornicroft et al. | 361/415 X |
| 3,910,537 | 10/1975 | Laboue et al. | 248/68.1 |
| 4,013,928 | 3/1977 | Sarinopoulos et al. | 211/41 X |
| 4,429,937 | 2/1984 | Stockmaster | 361/415 X |
| 4,913,016 | 4/1990 | Frei | 403/393 X |
| 5,049,087 | 9/1991 | Chung et al. | 439/62 |

*Primary Examiner*—Blair M. Johnson
*Assistant Examiner*—Korie H. Chan
*Attorney, Agent, or Firm*—Spencer, Frank & Schneider

[57] ABSTRACT

A component carrier for accommodating circuit boards includes two front module rails and two rear module rails which connect two parallel side walls with one another. Between the side walls, guide rails for insertion of the circuit boards are provided at the module rails. The frontal faces of the rear module rails are provided with threaded holes for screwing on backplanes. Insulating strips which are equipped with fastening elements and are clamped to the module rails by means of these fastening elements serve to insulate these backplanes against the module rails. The insulating strips are provided with holes which correspond to the threaded holes in the module rails.

4 Claims, 2 Drawing Sheets

INSULATING STRIP FOR A COMPONENT CARRIER

CROSS-REFERENCE TO RELATED APPLICATION

This application claims the priority of Application Ser. No. G 90/13,093.6, filed Sep. 14, 1990, in the Federal Republic of Germany, the subject matter of which is incorporated herein by reference.

BACKGROUND OF THE INVENTION

The present invention relates to a component carrier that accommodates circuit boards equipped with electrical circuits and is composed of at least two front and two rear module rails which connect two parallel side walls with one another and between which guide rails are disposed for the insertion of the circuit boards. The frontal faces of the rear module rails are each equipped with a row of equidistant threaded holes for screwing on backplanes.

The invention is applicable to component carriers for insertable circuit boards of any type and size.

The electrical circuits composed of electrical and electronic components that are interconnected on the circuit boards by way of conductor paths are generally interconnected within the component carrier by means of backplanes. These backplanes are equipped with four-pole connector strips into which engage the male multi-point connectors provided at the rear edges of the circuit boards to be inserted. The backplanes are usually screwed to the rear module rails of the component carriers.

In order to avoid undesirable electrical couplings and stray currents, it is advantageous to electrically insulate the backplanes against the rear module rails as a precautionary measure. The practical implementation of such an insulation, however, is fraught with problems that have not been solved in the prior art except for unsatisfactory mechanical contrivances.

SUMMARY OF THE INVENTION

It is an object of the invention to accomplish and ensure a proper and effective insulation of the backplanes against the rear module rails to which they are to be fastened in a component carrier.

To solve this problem, the invention is based on a component carrier that accommodates circuit boards carrying electrical circuits and is composed of at least two front module rails and at least two rear module rails which connect two parallel side walls with one another and between which guide rails are provided for insertion of the circuit boards, with the frontal faces of the rear module rails each being provided with a row of equidistant threaded holes for screwing on backplanes. The problem is solved by insulating strips that are equipped with fastening elements, are provided with holes corresponding to the threaded holes and are fastened to the rear module rails which, for this purpose, are equipped with holding means. Such insulating strips provided with the corresponding holes can be attached without problems to any desired location at the two rear module rails and may be releasably fastened by the holding means, for example by clamping. The backplane is then screwed onto the insulating strip, with the screws that serve to accomplish this passing through the holes in the insulating strips and being screwed unimpededly into the threaded holes of the module rails.

Advantageously clamping springs serve as the fastening elements so as to permit easy application and also easy removal.

Reliable fastening of the insulating members is realized if tabs are seated at the free ends of the clamping springs so as to engage in the holding means of the rear module rails.

Advisably, the insulating strips are given a U-shaped cross section which partially surrounds the module rails. This measure prevents lateral escape of the insulating strips when the backplanes are screwed on.

Good resiliency is obtained if the clamping springs are disposed facing one another at both sides of the insulating strips.

According to a further feature of the invention, at least one fixing pin projects at the underside of the insulating strips and projects into a threaded hole of the rear module rails. This fixing pin serves to adjust the holes in the insulating strips relative to the threaded holes of the module rails.

Economical manufacture results if the clamping springs and the fixing pin are shaped onto the insulting strip which is made of an electrically insulating plastic.

It is of advantage for the holding means to be at least one longitudinal groove that is disposed at the broadside of the module rails and near its frontal face. The tabs of the clamping springs are able to engage at any desired location in this longitudinal groove.

Advisably the longitudinal groove has a V-shaped cross section.

BRIEF DESCRIPTION OF THE DRAWINGS

One embodiment of the invention will now be described in greater detail with reference to the two attached drawing figures. These drawing figures show in.

DETAILED DESCRIPTION OF THE PREFERRED EMBODIMENT

Figure 1:
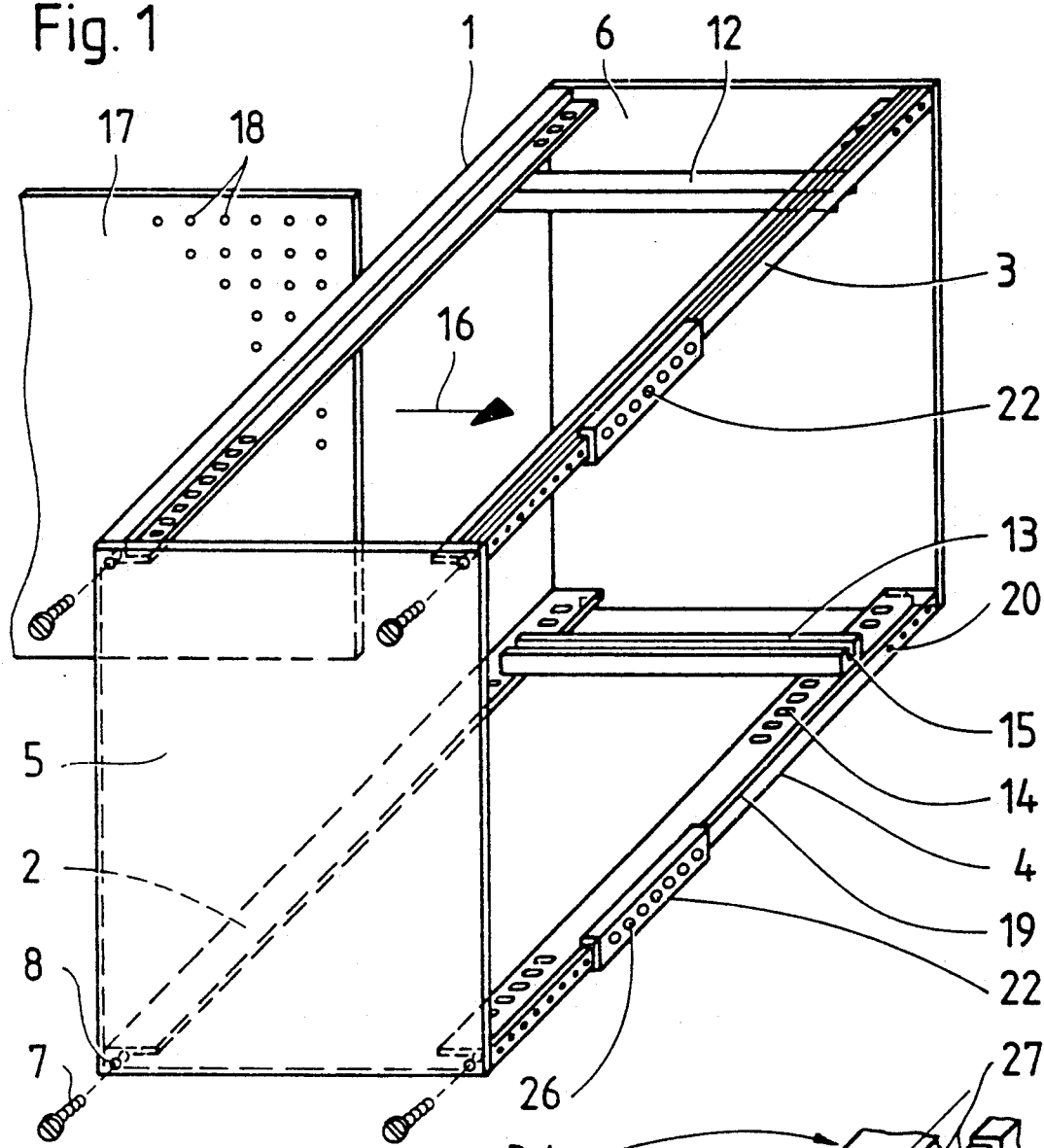
FIG. 1, a simplified perspective view, to a reduced scale, of a component carrier for accommodating circuit boards and comprising module rails and guide rails, two insulating strips being clamped to the rear module rails.

The component carrier shown in FIG. 1 and serving to accommodate circuit boards equipped with electrical circuits (composed of conductor paths and components) is composed of two front module rails 1 and 2, two rear module rails 3 and 4 and two parallel side walls 5 and 6.

Figure 2:
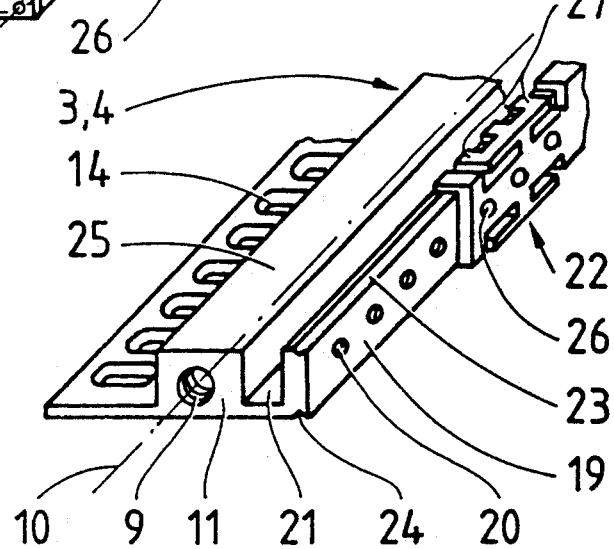
FIG. 2, an enlarged perspective view of a section of the upper rear module rail according to the invention with the front portion of a clamped on insulating strip according to the invention.

The four module rails 1 to 4 are specially shaped aluminum profiles and lie parallel to one another. They are screwed to side walls 5 and 6 and to their four corners with the aid of head screws 7 which pass through openings 8 in side walls 5 and 6 and are screwed into threads 9 (see FIG. 2) cut from both sides in the longitudinal direction 10 from end faces 11 into module rails 1 to 4.

Mutually oppositely directed upper and lower guide rails 12 and 13 are clamped by means of resilient clamping elements (not shown) to one of front module rails 1 and 2 and one of rear module rails 3 and 4 so as to extend transversely to module rails 1 to 4. These clamping elements are snapped into long holes 14 provided equidistantly next to one another in rows and along the longitudinal direction 10 of module rails 1 to 4.

The two identically configured guide rails 12 and 13 each are provided on their upper sides with a guide groove 15 having a rectangular cross section for circuit boards 17 that will be inserted from the front in the direction of arrow 16. One of these circuit boards is shown; it is equipped with hole arrangements 18 for attachment of the electrical and electronic components.

The front sides 19 of each of the two rear module rails 3 and 4 are provided with a row of equidistant threaded holes 20 which serve to screw on backplanes (mother boards—not shown). These threaded holes 20 end in a deep rectangular groove 21 provided parallel to the longitudinal direction.

Insulating strips 22 are clamped to the two rear module rails 3 and 4. For this purpose, these module rails 3 and 4 are provided with holding means in the form of two longitudinal grooves 23 and 24 (see FIG. 2) These longitudinal grooves 23 and 24, which have a V-shaped cross section, are disposed at broadsides 25 near the frontal face 15 of module rails 3 and 4.

Insulating strips 22 are composed of an electrically well insulating, elastic plastic and are significantly shorter than module rails 3 and 4; they are equipped with holes 26 which form a row and correspond with respect to their spacing with the threaded holes 20 of the rear module rails 3 and 4.

Figure 3:
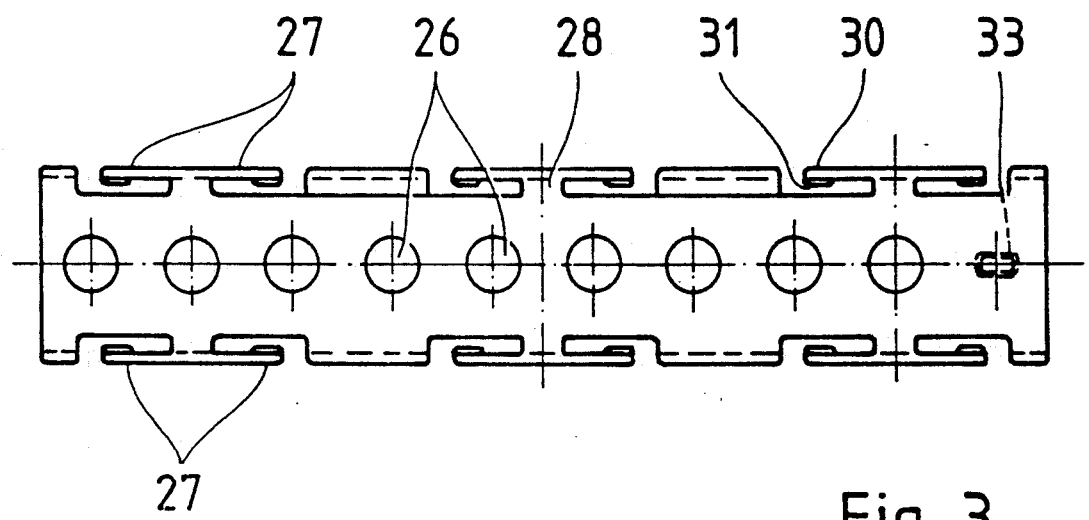
FIG. 3, a top view of the insulating strip, to a greatly enlarged scale.
Figure 4:
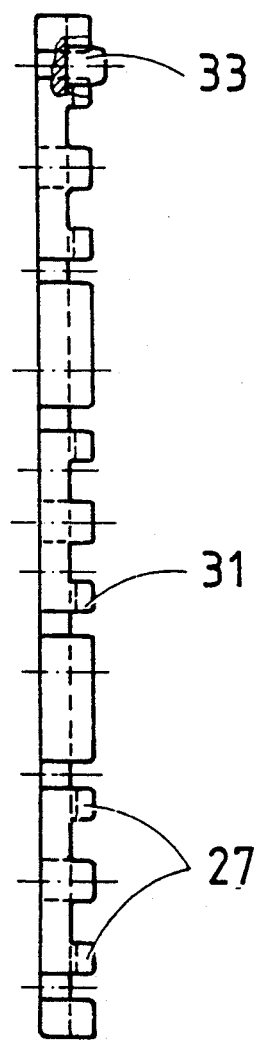
FIG. 4, a side view, to the same enlarged scale, of the insulating strip according to FIG. 3.
Figure 5:
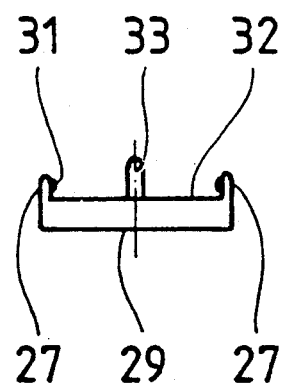
FIG. 5, a front view, again to an enlarged scale, of the insulating strip according to FIGS. 3 and 4.

Several elastic clamping springs 27 (see FIG. 3) provided in pairs serve as fastening means for insulating strips 22. They are shaped onto insulating strips 22 and are arranged opposite one another at their two sides. Insulating strip 22 has a U-shaped cross section (see FIG. 5) with which it partially encloses module rails 3 and 4 (see FIG. 2). Clamping springs 27 (seen in cross section) here are part of the legs of the U and are connected with the base of the U by way of webs 28. A pair of clamping springs 27 together with its associated web 28 has the shape of the letter T. The other parts of the legs of the 11 extend between the pairs of clamping springs 27. The leaf shaped, thin, elongate, rectangular clamping springs 27 lie behind one another in two parallel rows and in the longitudinal direction of insulating strip 25.

In the region of the free ends 30 of clamping springs 27, small tabs 31 are provided which engage in the holding means—the two longitudinal grooves 23 and 24—of the rear module rails 3 and 4.

A fixing pin 33 of approximately rectangular cross section and shaped to the base of the U projects from the underside 32 of insulating strip 22. The width of this fixing pin 33 is dimensioned in such a way that, with the insulating strip 22 shaped onto module rails 3, 4, it matingly projects into a threaded hole 20 in the rail 3 and 4, respectively.

It will be understood that the above description of the present invention is susceptible to various modifications, changes and adaptations, and the same are intended to be comprehended within the meaning and range of equivalents of the appended claims.

What is claimed is:

1. In a component carrier including
   two parallel side walls,
   two spaced front module rails each connecting the two side walls to one another and defining a front side of the component carrier,
   two spaced rear module rails each connecting the two side walls to one another and defining a rear side of the component carrier; each said rear module rail having, along a length thereof, a series of spaced screw holes for supporting a backplane at said rear side, each said rear module rail further having opposite longitudinal edges,
   support means attached to said front and rear module rails for supporting circuit boards introducible into and removable from said component carrier through the front side thereof;
   the improvement comprising insulating strips supported on said rear module rails and extending along length thereof; each said insulating strip including
   (a) two opposite spring elements engaging the opposite longitudinal edge of a respective said rear module rail for together resiliently clamping the insulating strip to the respective rear module rail;
   (b) a plurality of screw holes provided in the strip and extending therealong; the screw holes in said insulating strip being aligned with some of the screw holes in the respective rear module rail for allowing passage of a securing screw attaching a backplane to the rear module rails with an interposition of said insulating strip;
   (c) a longitudinal groove provided in each said longitudinal edge;
   (d) a projection formed on each spring; said projection extending into the groove of the respective rear module rail; and
   (e) a fixing pin attached to said insulating strip and extending into a selected said screw hole of the respective rear module rail.

2. A component carrier as defined in claim 1, wherein said insulating strips have a U-shaped cross section and straddle the respective rear module rail.

3. A component carrier as defined in claim 1, wherein each said groove has a V-shaped cross section.

4. A component carrier as defined in claim 1, wherein said insulating strip, said spring elements and said fixing pin constitute a single-piece part made of an electrically insulating plastic.

* * * * *